United States Patent [19]
Chi

[11] Patent Number: 6,160,286
[45] Date of Patent: Dec. 12, 2000

[54] METHOD FOR OPERATION OF A FLASH MEMORY USING N+/P-WELL DIODE

[75] Inventor: Min-hwa Chi, Hsinchu, Taiwan

[73] Assignee: Worldwide Semiconductor Manufacturing Corporation, Hsinchu, Taiwan

[21] Appl. No.: 09/422,050

[22] Filed: Oct. 20, 1999

[51] Int. Cl.[7] .............................. H01L 29/78; H01L 33/00
[52] U.S. Cl. ................................................................ 257/315
[58] Field of Search ............................................... 257/315

[56] References Cited

U.S. PATENT DOCUMENTS 5,814,853  9/1998  Chen .
5,847,426  12/1998  Bergemont .

Primary Examiner—Stephen D. Meier
Attorney, Agent, or Firm—Blakely, Sokoloff, Taylor and Zafman LLP

[57] ABSTRACT

A flash memory cell formed in a semiconductor substrate is disclosed. The cell includes a deep n-well formed within the substrate. Next, a p-well is formed within the deep n-well and a n+ drain region is formed within the p-well. A floating gate is formed above the p-well being separated from the substrate by a thin oxide layer. The floating gate is formed adjacent to the n+ drain region. Finally, a control gate is formed above the floating gate, the floating gate and the control gate being separated by a dielectric layer. The new cell is read by measuring the GIDL current at n+/p-well junction, which is exponentially modulated by the floating gate potential (or its net charge). The new cell is programmed by substrate hot electron injection and is erased by F-N tunneling through the overlap area of floating gate and p-well.

8 Claims, 4 Drawing Sheets

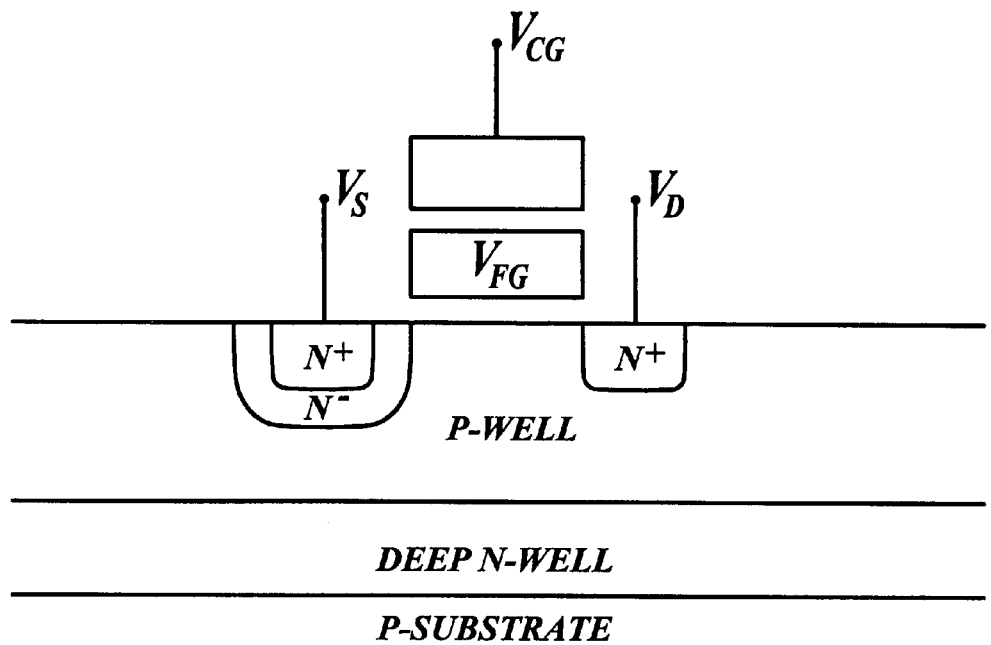
Fig. 1 *(PRIOR ART)*
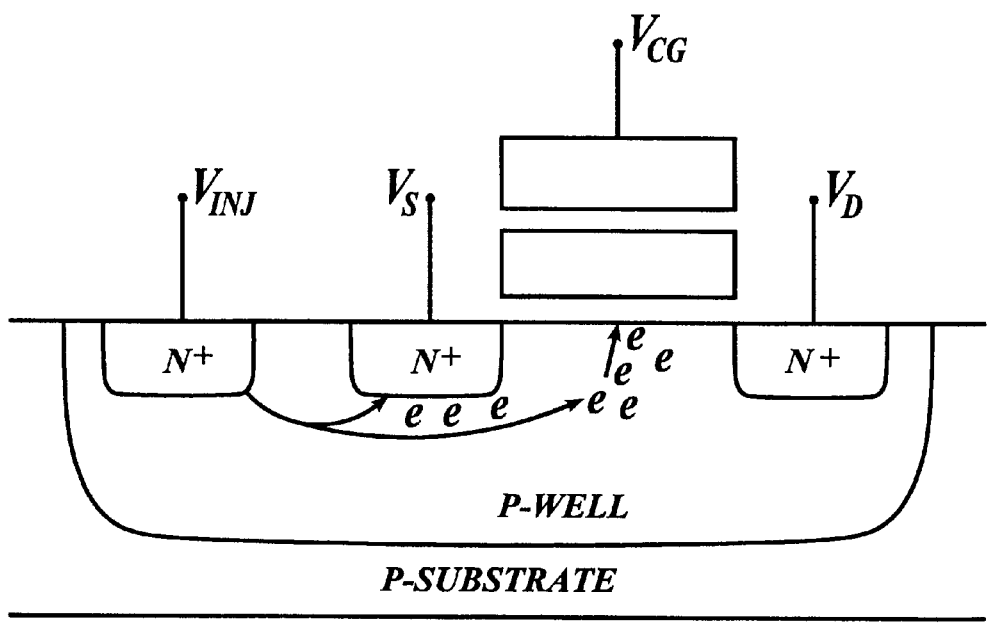
Fig. 2 *(PRIOR ART)*

METHOD FOR OPERATION OF A FLASH MEMORY USING N+/P-WELL DIODE

FIELD OF THE INVENTION

The present invention relates to flash memory, and more particularly, to a flash memory cell that uses a diode and double poly stack.

BACKGROUND OF THE INVENTION

The stack-gate ETOX-cell, one of the most popular cell structures for flash memories, is widely programmed by channel hot-electron (CHE) and erased by Fowler-Nordheim (FN) tunneling through the source side or the channel area.

The n-channel ETOX-cell is conventionally fabricated by a twin-well process or recently in a triple-well process as shown in FIG. 1. The triple-well structure is typically used to protect cells from noises generated outside the deep n-well by reverse-biasing the deep n-well to p-well junction, e.g., the deep n-well is biased to the highest potential (Vcc) and the p-well is biased to the lowest potential (Vss). The n+ source is typically doubly implanted by $As^{75}$ (with a high dose of $3E15/cm^2 \sim 1E16/cm^2$ for the n+ junction) and $P^{31}$ (with a lower dose of $\sim 1E14 cm^2$ for the n-junction) so that the source junction can be biased at high voltage (e.g. ~12 v) during erase operation. The n+ drain is typically implanted by As only with a high dose ($\sim 1E16/cm^2$) and the drain side does not need the lightly-doped-drain (LDD) implant and spacer structure.

Note that the LDD structure is not useful in an ETOX-cell, although it is important in CMOS transistors for reducing electrical field during switching for lower hot-electron generation. The tunnel oxide ($T_{ox}$) is typically 80–120 angstroms thick, the inter-poly dielectric ($T_{pp}$) typically consists of thin oxide-nitride-oxide (ONO) layers. As an example, a typical ETOX-cell based on 0.35 um CMOS design rule has the following cell parameters: $T_{ox} \sim 90$ angstroms, $T_{pp} \sim 160$ angstroms (oxide equivalent thickness), and control-gate to floating-gate coupling ratio of ~0.8.

The ETOX-cell of FIG. 1 is programmed by channel-hot-electrons (CHE). The bias for programming is typically: $V_d=7$ v, $V_{cg}=9$ to 12 v, and $V_s=0$ v. Under these bias conditions, there is a large channel current (~1 mA/cell) for hot electron generation near the channel surface of the drain. Hot electrons are injected into the floating-gate when the oxide energy barrier is overcome and when assisted by the positive control gate bias. After programming, the amount of net electrons on the floating-gate increases, which results in an increase of the cell threshold voltage ($V_T$). The electrons in the floating-gate will remain for a long time (e.g. 10 years at room temperature), unless intentionally erased. The drawback of CHE programming is low injection efficiency and large power consumption during programming.

The cell is erased by Fowler-Nordheim (F-N) tunneling through the source side or the channel area. The bias during source side erase is typically: $V_d \sim 0$ v or floating, $V_{cg} \sim -5$ v to 0 v, and $V_s=+9$ to +12 v. This establishes a large electrical field (~10 Mv/cm) across the tunnel oxide between the floating-gate and source overlap area. Electrons on the floating-gate will tunnel into the source and be removed away. It is known that there is large gate induced drain leakage (GIDL) current that occurs at the source side during erase as well as the associated degradation of the tunnel oxide.

The bias for F-N erase through the channel area is typically: $V_d \sim$floating, $V_{cg} \sim 15$ v, $V_{pw} \sim 0$ v. A large electrical field (~10 Mv/cm) can be established across the tunnel oxide between the floating-gate and the p-well channel area (in accumulation). Electrons on the floating-gate will tunnel into the channel area and be removed through the p-well bias. It is well known that a high negative voltage is required on the control-gate and the tunnel oxide is easily degraded by the high electrical field during erase.

The read biases of the prior art ETOX-cell are typically: $V_d \sim 1$ v to 2 v, $V_{cg} \sim V_{cc}$, $V_s \sim 0$ v, $V_{pw} \sim 0$ v, $V_{dnw}=Vcc$, and $V_{sub} \sim 0$ v. The channel may be inverted or not depending on the net electron charge stored on the floating-gate, and results in the on and off of the cell as measured by the read current $I_{read}$ representing the digital information of "1" or "0" stored in the cell.

The prior art ETOX-cell of FIG. 1 can be programmed by another method known as substrate-hot-electron (SHE) as shown in FIG. 2. As seen in FIG. 2, an additional n+ junction is needed (i.e., the "injection" junction) for injecting electrons through the forward-biased n+ injection junction to p-well junction. Unfortunately, most of the injected electrons are not diffused towards the channel area, but instead toward the nearby n+ source junction. Furthermore, the n+ source, p-well, and the n+ "injection" junction form a lateral npn bipolar transistor. The bipolar action of the npn bipolar transistor results in a large bipolar current at the node of n+ injection junction. Therefore, the SHE program scheme for the ETOX-cell is not only very slow but also requires a large cell size due to the additional "injection" junction. As a result, this type of SHE programming scheme is not popular in commercial EPROMs or ETOX flash memories.

What is needed is a method for manufacturing a flash cell having the advantages of small cell size and easily implemented as an array.

SUMMARY OF THE INVENTION

A flash memory cell formed in a semiconductor substrate is disclosed. The cell comprises: a deep n-well formed within said substrate; a p-well formed within said deep n-well; a n+ drain region formed within said p-well; a floating gate formed above said p-well, said floating-gate separated from said substrate by a thin oxide layer, said floating gate formed adjacent to said n+ drain region; and a control gate formed above said floating gate, said floating gate and said control gate separated by a dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a schematic diagram of a prior art ETOX-cell formed by a triple-well process;

FIG. 2 is a schematic diagram of a prior art ETOX-cell using an injection junction;

DETAILED DESCRIPTION OF THE PREFERRED EMBODIMENT

Figure 3:
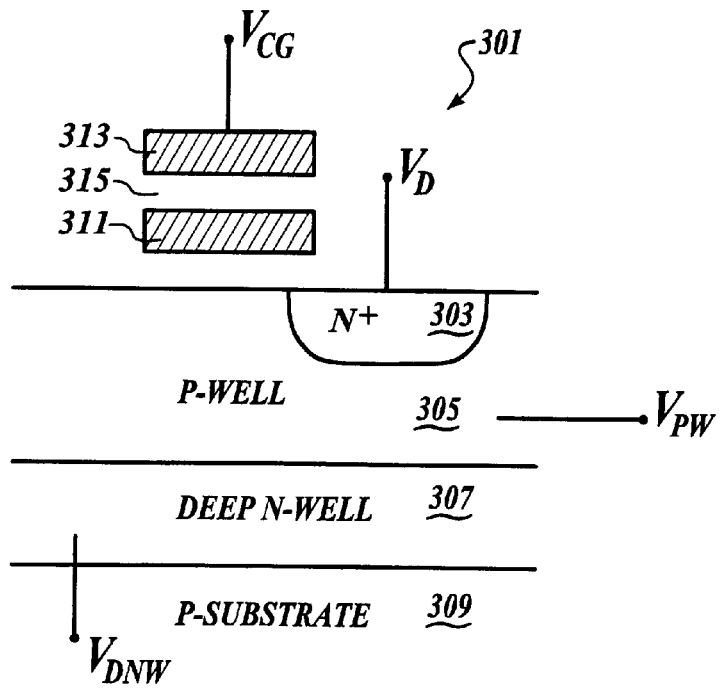
FIG. 3 is a schematic diagram of a flash memory cell formed in accordance with the present invention.

Turning to FIG. 3, an flash memory cell 301 formed in accordance with the present invention is shown. Note that the cell 301 is substantially similar to the n-channel ETOX-cell shown in FIG. 1, except that the n+ source in the prior art ETOX-cell has been removed. The cell 301 includes a n+ drain 303 formed in a p-well 305. The p-well 305 is formed in a deep n-well 307 that is formed in a p-type substrate 309. Formed atop of the p-well, but separated by a tunnel oxide, is a floating gate 311. The floating gate 311 is adjacent to the n+ drain 303. Formed atop of the floating gate 311, but separated by an interpoly dielectric 315, is a control gate 313.

Thus, many of the features are the same as in a conventional ETOX-cell. For example, for a 0.25 micron design rule, the tunnel oxide is ~80–105 angstroms thick, the interpoly dielectric 315 between the control gate 313 and the floating gate 311 is preferably a stack of oxide/nitride/oxide with about 100–180 angstroms (oxide equivalent) thickness. The control gate 313 has a coupling ratio to the floating gate 311 of about 0.7 to 0.8.

Figure 4:
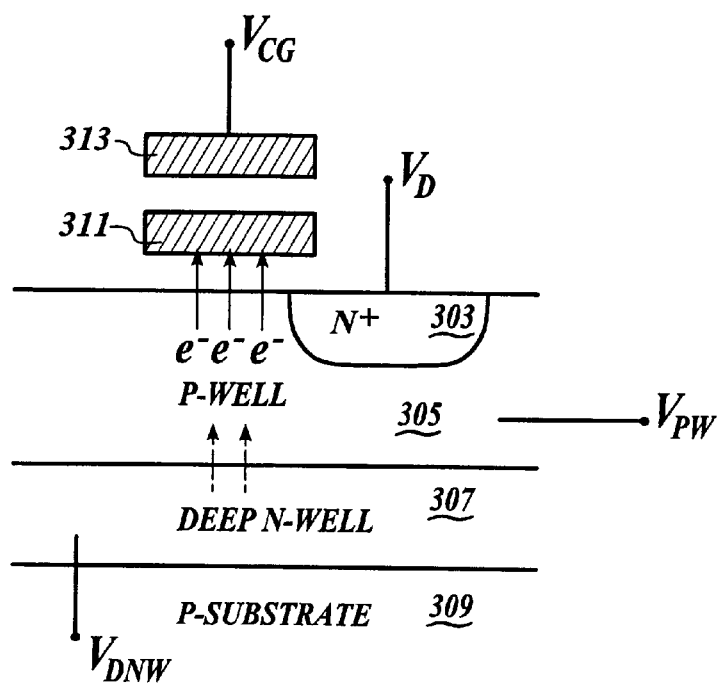
FIG. 4 is a schematic diagram of the cell of FIG. 3 during programming.

The operation of the cell 301 is described below. The cell 301 is programmed by vertical substrate hot electron (SHE) programming. Turning to FIG. 4, the n+ drain 303 bias ($V_d$) is $V_{cc}$ or higher (e.g. 3 to 5 volts). The control gate 313 bias ($V_{cg}$) is high enough (about 5 to 8 volts) to invert the channel underneath the floating gate 311. The inverted channel, which is shorted to the n+ drain 303, is therefore also biased to the drain bias ($V_d$). The deep n-well ($V_{dnw}$) is biased to zero volts.

The p-well 305 ($V_{pw}$) is slightly forward biased (about 0.5 volts) with respect to the deep n-well 307, so that electrons are injected from the deep n-well 307 into the p-well 305. The injected electrons are accelerated or "heated up" by the electrical field in the junction depletion region established by $V_d$ near the n+ drain 303 and the adjoining inversion layer. The electrons that are hot enough will be injected through the inversion layer toward the floating-gate.

The control gate voltage $V_{cg}$ also establishes a field in the tunnel oxide to assist hot electrons injecting into the floating gate. Note that the programming process will continue (i.e. more negative charge accumulated onto the floating-gate) until the channel inversion layer disappears.

Figure 5:
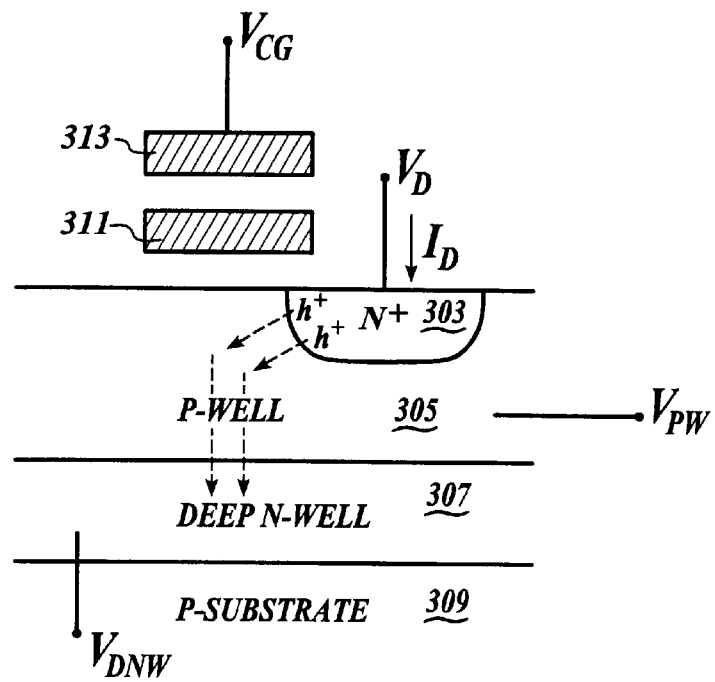
FIG. 5 is a schematic diagram of the cell of FIG. 3 during a read operation.

Next, turning to FIG. 5, the read operation of the cell 301 is next described. The read operation is based on the fact that the gate induced drain leakage (GIDL) current at the n+ drain 303 is strongly (exponentially) dependent on the electrical field between the drain 303 and the floating gate 311. As a result, it is sensitive to the net electron charge on the floating gate. The preferred bias for the read operation is as follows: $V_{cg}$ is $-V_{cc}$ (−3.3 volts); $V_d$ is biased at $V_{cc}$ (3.3 volts); $V_{pw}$ is 0 volts; and $V_{dnw}$ is $V_{cc}$ (about 3.3 volts). The field between the drain and floating gate of a programmed cell (i.e. electron charge on the floating gate) is larger than that of a non-programmed cell (i.e. no charge on the floating gate), resulting in at least 3 orders of magnitude difference in the GIDL current measured at the n+ drain. The magnitude of drain current $I_d$ is therefore strongly modulated by the floating-gate charge and represents the digital information "one" and "zero" stored in the cell 301.

An analysis of the GIDL current during the read operation is shown below. The floating-gate potential ($V_{fg}$) can be estimated by the law of charge conservation, i.e.

$$C_{pp}(V_{fg}-V_{cg})+(C_s+C_d)(V_{fg}-V_d)+C_{ch}(V_{fg}-V_d)=Q_f$$

Or $$V_{fg}=Q_f/C_t+V_{cg}\gamma_g+V_d(\gamma_d+\gamma_s+\gamma_{ch})$$

Where $C_t=C_{pp}+C_s+C_d+C_{ch}$. The coupling ratios are defined as the following: $\gamma_g=C_{pp}/C_t$; $\gamma_d=C_d/C_t$; $\gamma_s=C_s/C_t$; $\gamma_{ch}=C_{ch}/C_t$; and $\gamma_g+\gamma_d+\gamma_s+\gamma_{ch}=1$. $Q_f$ is the net charge on the floating-gate. When the cell is not programmed (i.e. "0"), there is no net charge on the floating-gate, i.e. $Q_f=0$. Thus, the floating-gate potential $V_{fg}$ for "0" during read is, $$V_{fg,0}=V_{cc}\gamma_d$$

(cell in "0")

When the cell is programmed (i.e. "1"), the maximum net charge on floating-gate at the end of programming can be estimated analytically by, $$Q_f/C_t \approx V_{to}-V_{cg(pg)}\gamma_g+V_{d(pg)}(\gamma_g+\eta)$$

where $V_{to}$ is the threshold voltage viewed from the floating-gate. $\eta$ is the coefficient of body-bias effect. Typically, $\eta \sim 0.15$. The $V_{cg(pg)}$ and $V_{d(pg)}$ are the biases during programming. See M. Chi et al., "A New Self-Convergent Programming and Erase Tightening by Substrate-Hot-Electron Injection for ETOX Cells in Triple Well," Paper G22, p. 199, International Symposium on VLSI Technology, Systems, and Applications, 1999. The read bias is $V_{cg}=0_v$ and $V_d=V_{cc}$. Thus, from the above equations, the $V_{fg}$ for "1" during read operation is, $$V_{fg,1}=V_{to}-V_{cg(pg)}\gamma_g+V_{d(pg)}(\gamma_g+\eta)+V_{cc}\gamma_d$$

(cell in "1")

The surface electric field at the tunneling point in the overlap region between the drain and the floating-gate is $$E_{d,fg}=(V_d-V_{fg}-1.12)/(3T_{ox})\text{(for n-type poly doping)}=(V_d-V_{fg})/(3T_{ox})\text{(for p-type poly doping)}$$

where $T_{ox}$ is the tunnel oxide thickness. The constant 1.12 represents the band gap of silicon material. The GIDL current (i.e. the $I_{read}$) is exponentially related to the magnitude of the field $E_{d,fg}$, which is related to the floating gate potential $V_{fg}$.

$$I_{read}=AE_{d,fg}\exp(-B/E_{d,fg})$$

where A and B are constants. B is ~21.3 Mv/cm from the published literature. Notice that p-type poly doping results in larger $E_{d,fg}$ by $1.12/(3T_{ox})$. Using typical bias values, the difference of $V_{fg}$ between "1" and "0" will be greater than 3 volts. This can result in at least 3 orders of magnitude difference in GIDL current at the n+ drain.

Figure 6:
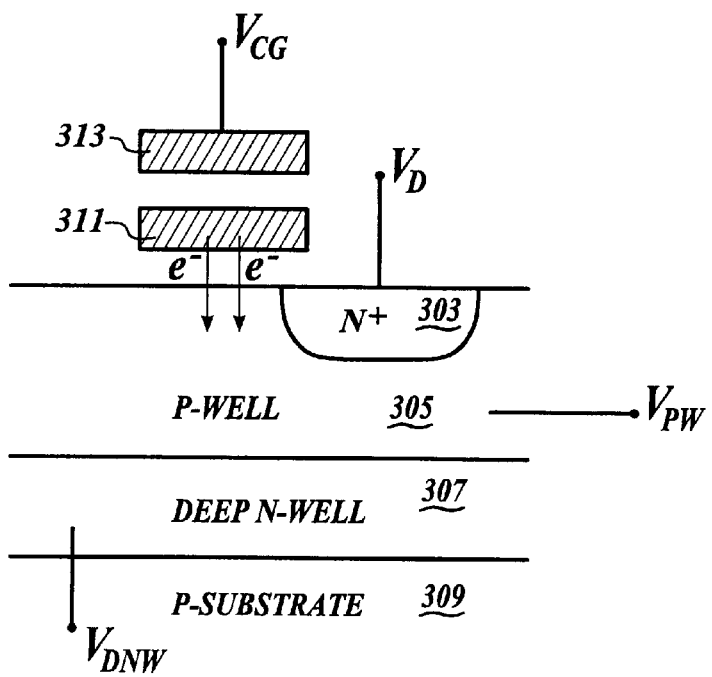
FIG. 6 is a schematic diagram of the cell of FIG. 3 during an erase operation.

Turning to FIG. 6, the erase action of the cell 301 can be seen. It is similar to conventional Fowler-Nordheim tunneling through the channel. There is a high enough field (>10 MV/cm) established between the n+ drain 305 and the floating-gate so that electrons on the floating-gate can tunnel by Fowler-Nordheim tunneling into the channel/drain/source area and be removed away. Preferably, the n+ drain 303, the p-well $V_{pw}$, and the deep n-well $V_{dnw}$ are all biased to $V_{cc}$ (about 3–5 volts) and the control gate voltage $V_{cg}$ is ~−6 to −10 volts.

There are several advantages of the cell 301 of the present invention and its operation. First, compared to an ETOX cell, there is no source and thus no need for a source interconnection. The cell 301 is therefore significantly smaller than the prior art ETOX cell.

Second, the n+ drain 303 does not carry a large current during all operations. Therefore, a buried n+ line (i.e.

diffusion area used as n+ drain) is suitable for cell operations. This will eliminate the contact and metal interconnect of n+ drains and further reduce the cell size.

Third, the vertical SHE programming and Fowler-Nordheim erase through the channel are all low current and low power operations. Finally, the GIDL read operation is insensitive to temperature due to the nature of the GIDL mechanism.

Figure 7:
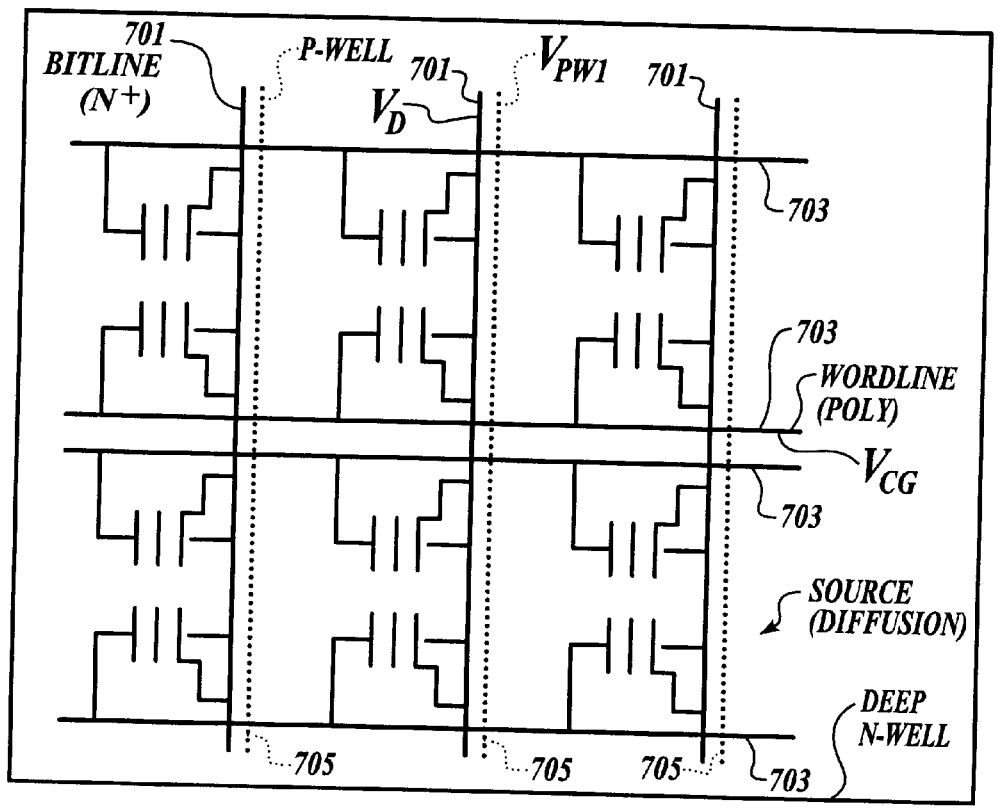
FIG. 7 is a NOR array formed from the cells of the present invention.

The cells 301 disclosed herein can be advantageously configured into a NOR array as shown in FIG. 7 with the following features. The n+ drains of cells in a common column are connected to a column bitline 701 through a buried n+ region (contactless array) or by a conventional contact and metal line. The p-wells of cells in a column are fabricated in one p-well 705. The p-well of each column is isolated from adjacent p-wells. The control gate of cells in a common row are connected to the row wordlines 703. There is no need for a source connection. This results in a simpler array architecture and wordline decoder design.

During programming of a single cell, the bias of selected column bitline 701 ($V_d$) is $V_{cc}$ (e.g. 3.3 volts), and the selected row wordline 703 bias ($V_{cg}$) is about 5 to 8 volts. The selected column p-well line 705 bias ($V_{pw}$) is forward biased (about 0.5 volts) with respect to the deep n-well ($V_{dnw}$) (which is grounded) for electron injection. All non-selected column bitlines 701 are biased to 0 volts and the non-selected wordlines 703 are biased to 0 volts.

To program cells in an entire row, all column bitlines 701 are selected and biased according to the input digital information (e.g. bitline bias to 3.3 volts as a "1" and 0 volts for a "0"). All column p-well lines are forward biased (to about 0.5 volts) and the deep n-well is biased to 0 volts. The selection wordline is biased to high (e.g. 5 to 8 volts); all non-selected wordlines are biased to 0 volts.

To program all cells in a column, then all row wordlines 703 are selected and biased according to the input digital information (e.g. 5 to 8 volts for a logical "1" and 0 volts for a logical "0"). The selected column p-well 705 is forward biased. The selected column bitline 701 is biased to 3.3 volts, and all non-selected bit-lines are biased to 0 volts. In short, either single bit programming, column programming, or row programming can be implemented in this array with high efficiency. After programming, the deep n-well is biased to $V_{cc}$.

During the read operation, the selected row wordline 703 is biased to low (e.g. 0 volts to −3.3 volts), and selected column bitlines 701 are biased to high (e.g. 3.3 volts). All non-selected row wordlines 703 and all non-selected bitlines 701 are biased to low (i.e. 0 volts) to avoid disturb. The magnitude of the GIDL current in a column bitline represents the digital information stored in the cell. Those cells programmed with (negative) electron charge on the floating-gate will have ~3 orders of magnitude larger GIDL current than those without electrons on the floating-gate.

During the erase operation, cells in a selected row wordline 703 can be erased by biasing the wordline to low (e.g. −6 volts to −10 volts), while biasing the column bitline 701 and p-well line 705 to $V_{cc}$. Cells are erased by Fowler-Nordheim tunneling through the channel area. Non-selected rows (wordlines) are biased to 0 volts. Certainly, more than one row or even all rows can be selected and erased efficiently.

While the preferred embodiment of the invention has been illustrated and described, it will be appreciated that various changes can be made therein without departing from the spirit and scope of the invention.

What is claimed is:

1. A method for programming a flash memory cell formed in a semiconductor substrate comprising:
   a deep n-well formed within said substrate;
   a p-well formed within said deep n-well;
   a n+ drain region formed within said p-well;
   a floating gate formed above said p-well, said floating-gate separated from said substrate by a thin oxide layer, said floating gate formed adjacent to said n+ drain region; and
   a control gate formed above said floating gate, said floating gate and said control gate separated by a dielectric layer;
   said method comprising:
      forward biasing said p-well relative to deep n-well;
      biasing said control gate by a voltage sufficient to invert the channel underneath said floating gate; and
      positively biasing said n+ drain region.

2. The method of claim 1 wherein during programming said deep n-well is grounded and said p-well is positively biased.

3. The method of claim 1 wherein during programming said control gate is biased to between 5 to 8 volts and said n+ drain region is biased to between 3 to 5 volts.

4. A method for erasing a flash memory cell formed in a semiconductor substrate comprising:
   a deep n-well formed within said substrate;
   a p-well formed within said deep n-well;
   a n+ drain region formed within said p-well;
   a floating gate formed above said p-well, said floating-gate separated from said substrate by a thin oxide layer, said floating gate formed adjacent to said n+ drain region; and
   a control gate formed above said floating gate, said floating gate and said control gate separated by a dielectric layer;
   said method comprising:
      biasing said p-well, said deep n-well, and said n+ drain region to between 3 to 5 volts; and
      biasing said control gate by a negative voltage sufficient to induce Fowler-Nordheim tunneling into the p-well.

5. The method of claim 5 wherein said control gate is biased to between −6 and −10 volts.

6. A method for reading a flash memory cell formed in a semiconductor substrate comprising:
   a deep n-well formed within said substrate;
   a p-well formed within said deep n-well;
   a n+ drain region formed within said p-well;
   a floating gate formed above said p-well, said floating-gate separated from said substrate by a thin oxide layer, said floating gate formed adjacent to said n+ drain region; and
   a control gate formed above said floating gate, said floating gate and said control gate separated by a dielectric layer;
   said method comprising:
      biasing said deep n-well and said n+ drain region to $V_{cc}$; and
      biasing said control gate to a zero or a negative voltage.

7. The method of claim 6 wherein said p-well is biased to zero volts.

8. The method of claim 6 wherein $V_{cc}$ is between 3 and 5 volts.

* * * * *